United States Patent [19]

Choe

[11] Patent Number: 5,103,119
[45] Date of Patent: Apr. 7, 1992

[54] TTL-LEVEL BICMOS DRIVER

[75] Inventor: Myung J. Choe, Incheon, Rep. of Korea

[73] Assignee: Samsung Electronic Co., Ltd., Suweon, Rep. of Korea

[21] Appl. No.: 594,828

[22] Filed: Oct. 9, 1990

[30] Foreign Application Priority Data

Dec. 29, 1989 [KR] Rep. of Korea ............... 89-20225

[51] Int. Cl.⁵ ................. H03K 19/02; H03K 17/60
[52] U.S. Cl. ............................. 307/446; 307/300; 307/456
[58] Field of Search ............ 307/446, 451, 570, 300, 307/449, 456, 460, 443, 475

[56] References Cited

U.S. PATENT DOCUMENTS

| | | | |
|---|---|---|---|
| 4,678,943 | 7/1987 | Uragami et al. | 307/443 |
| 4,703,203 | 10/1987 | Gallup et al. | 307/446 |
| 4,808,850 | 2/1989 | Masuda et al. | 307/451 |
| 4,829,201 | 5/1989 | Masuda et al. | 307/446 |
| 4,902,914 | 2/1990 | Masuoka | 307/570 |
| 4,970,414 | 11/1990 | Ruth, Jr. | 307/446 |

Primary Examiner—Edward P. Westin
Assistant Examiner—Andrew Sanders
Attorney, Agent, or Firm—Ladas & Parry

[57] ABSTRACT

A TTL-level BiCMOS driver comprises a oversaturation preventing part for preventing oversaturation in following parts including two diodes connected to each supply voltage, an inverter connected to the diodes and including a PMOS transistor and a NMOS transistor of which drain is connected to an input terminal; an inverter part connected to the oversaturation preventing part including a transistor and a diode connected to the emitter of the transistor and a resistor connected to the drain thereof and an inverter; and a switching part including first and second switching parts, the first switching part having an inverter connected to the input terminal, a PMOS transistor connected to the inverter, darlington transistors and a NMOS transistor connected to the base of one of the switching part having a transistor turned on according to the driving of the transistor in the inverter part and a NMOS transistor connected to the input terminal and a base of the transistor in the second switching part. According to the present invention, the TTL-level BiCMOS driver can achieve the improvement of switching speed and the reduction of power consumption.

5 Claims, 1 Drawing Sheet

TTL-LEVEL BICMOS DRIVER

BACKGROUND OF THE INVENTION

The present invention relates to logic circuits using bipolar and MOS transistors and more particularly to a TTL-level BiCMOS driver which includes MOS transistors to improve switching speed and power consumption of TTL logic circuits.

In general, TTL circuits are widely used in the field of logic circuits. FIG. 1 shows such an inverter of conventional TTL circuits. In FIG. 1, if an input node VIN is in a low level state, a switching transistor Q1 is turned off and the base potential of a transistor Q2 rises. Thus, the transistors Q2 and Q3 together forming a Darlington circuit are turned on, while a switching transistor Q4 is turned off in response to the turning off of the transistor Q1 so that an output node VOUT becomes a high level state.

To the contrary, if the input node is in a high level state, the transistor Q1 is turned on and the base potential of the transistor Q2 comes down. Thus, the transistors Q2 is turned off together with another transistor Q3, so that the output node VOUT becomes a low level state.

According to this conventional TTL circuit, the charge stored in the base of the transistor Q3 should be discharged fast by connecting a resistor R1 thereto in order to achieve a fast switch of the voltage of the output node VOUT from the high level state to the low level. However, the current flows continuously through the resistor R1 when the transistor Q3 is turned on, thereby resulting in the considerable power consumption.

Moreover, in order to maintain the low level state of the output voltage VOUT, the saturation voltage for turning on the transistors Q1 and Q4 should be applied, thereby resulting in the considerable delay for switching time from the low level to high level of the output voltage VOUT.

SUMMARY OF THE INVENTION

The present invention has an object to provide a TTL-level BiCMOS driver which improves the switching speed and the power consumption by providing an oversaturation preventing part comprising CMOS transistors in its input terminal and a current leakage preventing transistors in its output terminal.

According to the present invention, there is provided a TTL-level BiCMOS driver comprising: a oversaturation preventing part for preventing oversaturation in following parts by providing a current leakage preventing signal according to an input signal to be applied to an input terminal, an inverter part connected to said oversaturation preventing part for providing a switching control signal according to an output of said oversaturation preventing part; and a switching part having first and second switching parts which are interconnected and also connected with said input terminal, said oversaturation preventing part and said inverter part for providing a logic signal according to the input signal applied to said input terminal.

BRIEF DESCRIPTION OF DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to the accompanying drawings.

Figure 1:
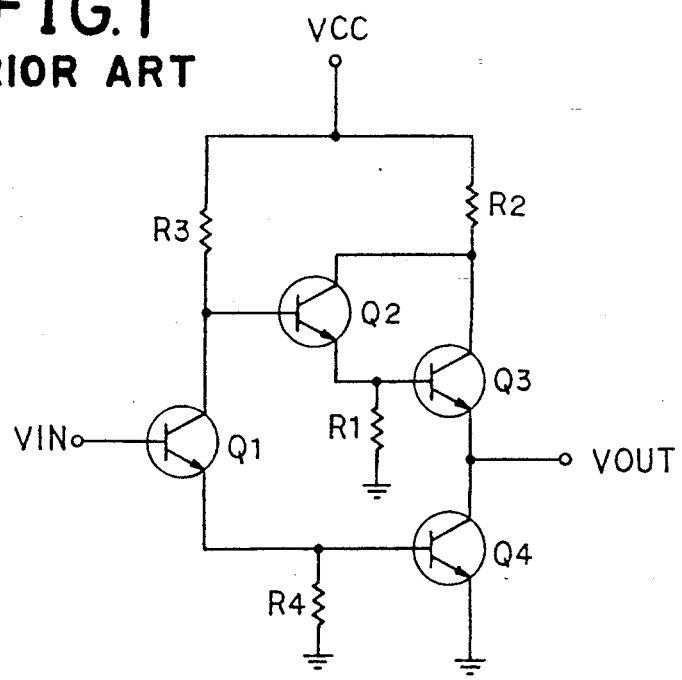
FIG. 1 is a circuit diagram illustrating an inverter of the conventional TTL logic circuits.
Figure 2:
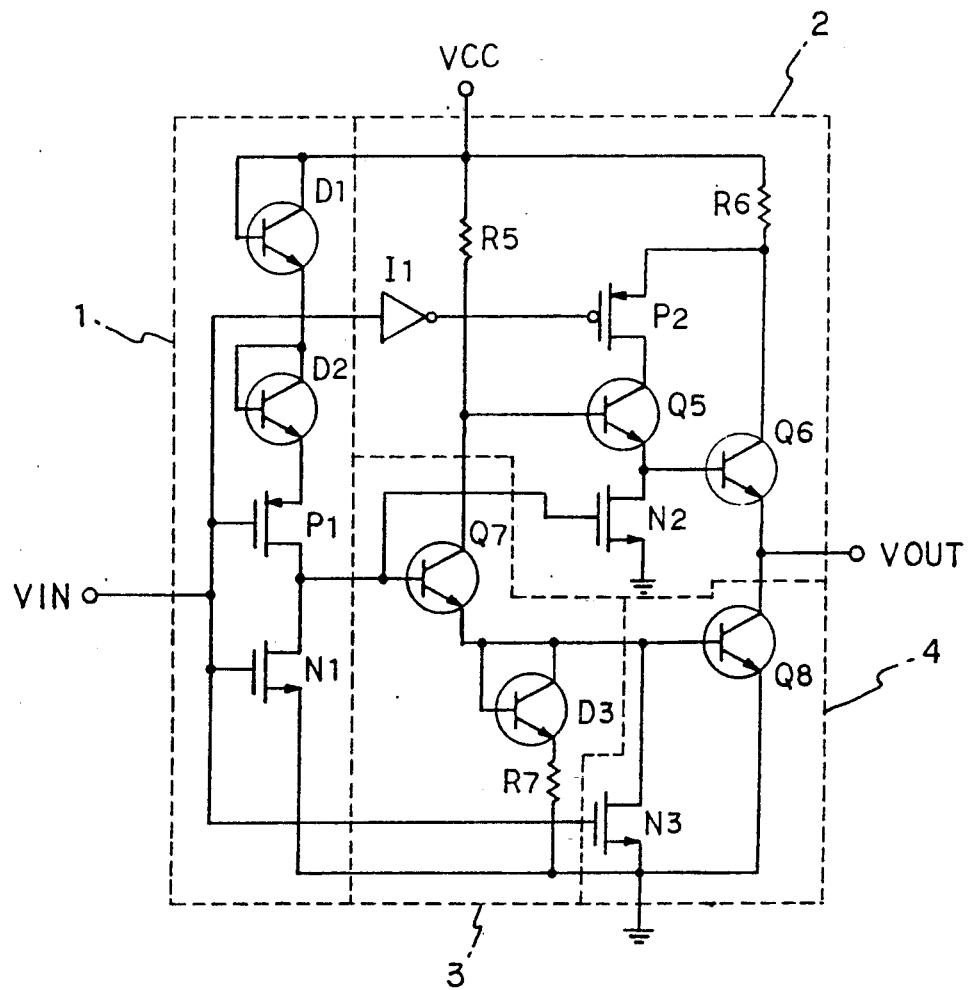
FIG. 2 is a circuit diagram illustrating a TTL-level BiCMOS driver according to the present invention.

FIG. 2 shows a TTL-level BiCMOS driver according to the present invention which comprises an oversaturation preventing part 1, an inverter part 3, and a switching circuit having first and second switching parts 2 and 4.

To describe in more detail, the oversaturation preventing part 1 provides a current leakage preventing signal to the first switching part 2 to prevent the oversaturation state both of the inverter part 3 and the second switching part 4. This oversaturation preventing part 1 comprises level-dropping diodes D1, D2 and PMOS and NMOS transistors P1 and N1 to serve as an inverter according to a signal of an input terminal VIN. The diodes D1 and D2 connected in series to a supply voltage VCC are connected with the source of the PMOS transistor P1 and also connected with the input terminal VIN.

The first switching part 2 is connected to the input terminal VIN, the oversaturation preventing part 1 and the inverter part 3 and comprises an inverter I1, a PMOS transistor P2, an NMOS transistor N2, and transistors Q5 and Q6 forming a Darlington circuit. The gate of the PMOS transistor P2 is connected to the inverter I1 for providing an inverted signal from an input signal of the input terminal VIN and the Darlington transistors Q5 and Q6 are turned on in response to the driving of the PMOS transistor P2 by a control signal from the inverter part 3.

Furthermore, the first switching part 2 includes the NMOS transistor N2 to prevent the leakage of current at the base of the transistor Q6 and turned on temporarily by the charge stored in the base of the transistor Q6 and the signal of the oversaturation preventing part 1 when the transistor Q5 is turned off.

The inverter part 3 is connected to the input terminal VIN and the oversaturation preventing part 1 for providing a switching control signal and comprises a switching transistor Q7 which is turned on in response to the driving of the PMOS transistor P1 a resistor R5 and a diode D3 for raising the threshold voltage level for turning on the transistor Q7.

The second switching part 4 comprises a transistor Q8 for switching and a NMOS transistor N3, in which the transistor Q8 for switching is connected to the emitter of the transistor Q7 to be turned on in response to the driving of the transistor Q7. Also, the NMOS transistor N3 is turned on temporarily by the charge stored in the base of the transistor Q8 when the transistor Q8 is turned off.

In the present invention, if the input signal is in a high level state, the PMOS transistor P1 is turned off, and subsequently the transistors Q7, Q8, and the NMOS transistor N2 are turned off. The high level input signal is inverted to a low level state by the inverter I1 and subsequently applied to the gate of the PMOS transistor P2.

In that case, the transistor Q7 is turned off so that the voltage at the base potential of the transistor Q5 rises up to the high level state thereby turning on the Darlington transistors Q5 and Q6 as well as the PMOS transistor P2. Thus, the output voltage from an output terminal VOUT becomes the high level state. But, the NMOS transistor N2 connected to the emitter of the transistor Q5 is turned off in response to the turning off of the PMOS transistor P1 in the oversaturation preventing part 1. Thus, the current discharge to the ground resulting in the leakage of current in the conventional TTL circuits can be efficiently prevented.

To the contrary, if the input node of the input terminal VIN is inverted from the high level state to a low level state, the PMOS transistor P1 is turned on while the NMOS transistor N1 is turned off so as to raise the voltage level at the base of the transistor Q7. Thus, the transistor Q7 is turned on in a saturation region, but the degree of the saturation of the transistor Q7 is diminished by the diodes D1 and D2 in the oversaturation preventing part 1.

According to the turning-on of the transistor Q7, the voltage level at the base of the transistor Q8 rises and the transistor Q8 is turned on. On the other hand, the NMOS transistor N3 connected to the base of the transistor Q8 is turned off in response to the turning-on of the transistor Q8, because the gate voltage of the NMOS transistor is identical to that of the input terminal VIN which is in the low level state, so that the current discharge to the ground resulting in the current leakage can be efficiently prevented.

Also, the low level input is inverted to a high level state by the inverter I1 and subsequently applied to the gate of the PMOS transistor P2 so as to turn off the PMOS transistor P2. Thus, the Darlington transistors Q5 and Q6 are turned off and the output voltage of the output terminal VOUT becomes the low level state, where the charge stored in the base of the transistor Q6 is to be discharged to the ground by the NMOS transistor N2 which is turned on in response to the driving of the PMOS transistor P1, so that the switching speed of the transistor Q6 can be efficiently improved.

Similarly, the charge is stored in the base of the transistor Q8 in the second switching part 4 when the transistor Q8 is turned on by the low level input. This stored charge is to be discharged to the ground in response to the turning-on of the NMOS transistor N3 when the transistor Q8 is turned off, where the NMOS transistor N3 is turned on by the high level input of the input terminal VIN. Consequently, the switching speed of the transistor Q8 can be efficiently improved.

As mentioned hereinabove according to the present invention, the switching speed can be efficiently improved and the power consumption can be minimized by the oversaturation preventing part and the transistors for preventing the current leakage at the switching part and for discharging rapidly the charge stored in the base of the transistors adjacent to the output terminal.

The present invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A TTL-level BiCMOS driver comprising:
   an oversaturation preventing means for preventing oversaturation in circuit means connected to said oversaturation preventing means, said oversaturation preventing means further providing a current leakage preventing signal to a switching means, according to an input signal to be applied to an input terminal,
   an inverter means connected to said oversaturation preventing means for providing a switching control signal according to an output of said oversaturation preventing means; and said switching means having a first and second switching parts which are interconnected and also connected with said input terminal, said oversaturation preventing means and said inverter means for providing at an output terminal a logic signal according to the input signal applied to said input terminal.

2. A TTL-level BiCMOS driver according to claim 1, wherein said oversaturation preventing means comprises:
   a plurality of diodes connected to a supply voltage; and
   an inverter connected to said diodes including a PMOS transistor to be driven according to an input signal of said input terminal and a NMOS transistor having a drain connected to said PMOS transistor and a gate being connected to said input terminal.

3. A TTL-level BiCMOS driver according to claim 1, wherein said inverter means comprises:
   a first transistor to be turned on according to the driving of a PMOS transistor in said oversaturation preventing means; and a diode connected to the emitter of said first transistor, for raising a bias voltage level up to turn on said first transistor.

4. A TTL-level BiCMOS driver according to claim 1, wherein said first switching part includes:
   an inverter connected to said input terminal;
   a PMOS transistor connected to said inverter for preventing the leakage of current and driven according to a signal of said inverter;
   Darlington transistors connected to said PMOS transistor, being turned on when a transistor in said inverting means is turned off; and
   a NMOS transistor connected to the base of one of said Darlington transistors for preventing the current leakage, driven according to a signal of said oversaturation preventing means.

5. A TTL-level BiCMOS driver according to claim 1, wherein said second switching part includes:
   a transistor being turned on according to the driving of a transistor in said inverting means and
   an NMOS transistor connected to said input terminal and a base of said transistor, being driven according to an input signal of said input terminal.

* * * * *